United States Patent
Ko et al.

(10) Patent No.: US 7,172,964 B2
(45) Date of Patent: Feb. 6, 2007

(54) METHOD OF PREVENTING PHOTORESIST POISONING OF A LOW-DIELECTRIC-CONSTANT INSULATOR

(75) Inventors: Chung Chi Ko, Nantou (TW); Syun Ming Jang, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 198 days.

(21) Appl. No.: 10/890,622

(22) Filed: Jul. 14, 2004

(65) Prior Publication Data

US 2005/0282382 A1  Dec. 22, 2005

Related U.S. Application Data

(60) Provisional application No. 60/521,703, filed on Jun. 21, 2004.

(51) Int. Cl.
*H01L 21/4763* (2006.01)

(52) U.S. Cl. ............... 438/627; 438/637; 257/E21.029

(58) Field of Classification Search ............... 438/618, 438/624, 627, 637
See application file for complete search history.

(56) References Cited

U.S. PATENT DOCUMENTS

| | | | |
|---|---|---|---|
| 5,926,740 A * | 7/1999 | Forbes et al. ............... 438/763 |
| 6,297,521 B1 | 10/2001 | Forbes et al. |
| 6,372,661 B1 | 4/2002 | Lin et al. |
| 6,376,392 B1 | 4/2002 | Lee et al. |
| 6,391,761 B1 * | 5/2002 | Lui ............................ 438/618 |
| 6,602,780 B2 * | 8/2003 | Shih et al. .................. 438/637 |
| 2005/0101119 A1 * | 5/2005 | Li et al. ...................... 438/624 |

* cited by examiner

*Primary Examiner*—Alexander Ghyka
(74) *Attorney, Agent, or Firm*—Haynes and Boone, LLP

(57) ABSTRACT

A method comprises forming a low-dielectric constant (low-k) layer over a semiconductor substrate, forming an anti-reflective layer over the low-k layer, forming at least one opening in the anti-reflective layer and in the low-k layer, forming a nitrogen-free liner in the at least one opening, and forming at least one recess through the nitrogen-free liner, the anti-reflective layer, and at least partially into the low-k layer, the at least one recess is disposed over the at least one opening.

24 Claims, 2 Drawing Sheets

METHOD OF PREVENTING PHOTORESIST POISONING OF A LOW-DIELECTRIC-CONSTANT INSULATOR

RELATED APPLICATION

This application claims priority of U.S. Patent Application No. 60/521,703 filed Jun. 21, 2004, and entitled, "Method of Preventing Photoresist Poisoning of a Low-Dielectric-Constant Insulator".

BACKGROUND

As advances in semiconductor technology reduce the feature sizes of the devices, integrated circuit density increases. This high density of devices requires closely spaced metal lines in low-dielectric constant (low-k) insulators to interconnect these closely spaced devices. A low-k insulator is advantageous to reduce the capacitance between the closely spaced metal lines, thereby reducing the RC time constant in the metal lines and improving circuit performance.

One of the problems associated with using a low-k insulator is photoresist poisoning or contamination during processing. For example, when photoresist is used directly on low-k insulators, photoresist poisoning can occur. One known method is to use a SiON liner in contact openings in the low-k insulator to minimize the photoresist poisoning. However, these SiON liners are not completely effective.

BRIEF DESCRIPTION OF THE DRAWINGS

The objectives and other advantages of this invention are best understood with reference to the preferred embodiment and the drawings in the figures.

DESCRIPTION OF THE PREFERRED EMBODIMENT

Embodiments of a method for fabricating contact openings in an insulating layer having a low-dielectric constant (low-k) is described. An embodiment of this method uses a novel nitrogen-free liner to prevent photoresist poisoning of the low-k insulating layer while avoiding nitrogen that can adversely affect the dielectric constant of the low-k insulator. Although the method is described for a silicon substrate prevalent in the industry, it should be understood by those skilled in the art that this disclosure is also applicable to other types of substrates such as gallium arsenide and the like.

Figure 1:
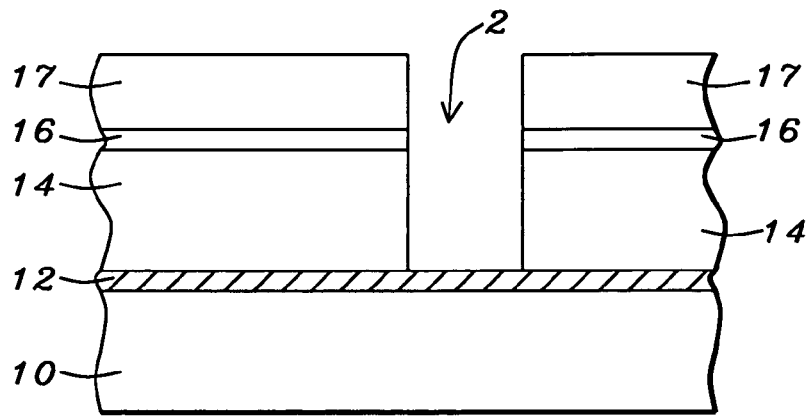
FIGS. 1 through 6 are cross-sectional views showing an embodiment of a sequence of process steps for making contact openings in a low-dielectric-constant (low-k) insulating layer using a liner to prevent subsequent photoresist contamination.

Referring now to FIG. 1, a semiconductor substrate 10 having a partially completed integrated circuit such as FETs and the like is shown. The detailed FET structures are not depicted in the drawings since they are not essential to understanding the invention. The substrate 10 may be one that is typically used in the industry, for example, a single-crystal silicon having a <100> crystallographic orientation. However, the invention can be used on other substrates, such as gallium arsenide, and the like, where low-dielectric-constant insulators are applicable to reduce the RC time constant to the circuit. Other substrates to be developed in the future may also benefit from the embodiments of the method described herein. An etch-stop layer 12 is formed on the substrate 10. The etch-stop layer 12 is preferably composed of an electrically-conducting material, such titanium nitride, tantalum nitride, silicon carbide, and may be formed or deposited by plasma-enhanced chemical-vapor deposition (PECVD). The etch-stop layer 12 may be formed to a thickness of between 50 and 500 Angstroms.

Still referring to FIG. 1, a low-dielectric constant (low-k) layer 14, which is used as an interlevel dielectric (ILD) layer, is formed or deposited on the etch-stop layer 12. The low-k layer 14 may be a material such as SiOCH and the like formed by PECVD, for example. Further, the low-k layer may be an organic or inorganic material now known or later developed, such as porous silicon oxide, carbon-doped oxide, hydrogen silsesquioxane (HSQ), fluorine-doped silicate glass (FSG), BLACK DIAMOND (Applied Materials of Santa Clara, Calif.), xerogel, aerogel, amorphous fluorinated carbon, parylene, bis-benzocyclobutenes (BCB), SILK (Dow Chemical of Midland, Mich.), and DENDRIGLASS (IBM of White Plains, N.Y.). The ILD low-k layer 14 may have a thickness of between about 2000 and 8000 Angstroms, for example.

Next, an anti-reflective coating (ARC) 16 may be formed on the low-k layer 14. The ARC layer 16 may be, for example, silicon oxycarbide (SiOC) or other suitable materials and formed by CVD using reactant gases such as silane ($SiH_4$) and carbon dioxide ($CO_2$), for example. The ARC 16 may have a thickness between about 150 and 1500 Angstroms. Using conventional photolithographic techniques, a first photoresist layer 17 may be formed and patterned for etching contact openings 2 in the ARC layer 16 and in the low-k layer 14. Anisotropic plasma etching may be used to form the contact openings 2 in the ARC 16 and the low-k layer 14 down to the etch-stop layer 12. Plasma etching may be carried out using high-density plasma etching and an etchant gas mixture such as one containing $HF_3$. After etching the contact openings 2, the remaining portions of the first photoresist layer 17 are removed.

Figure 2:
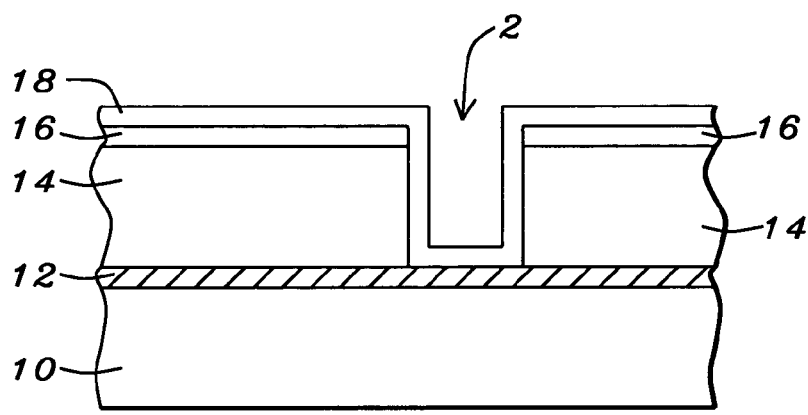

Referring to FIG. 2, a conformal liner 18 is formed on the ARC 16 and in the contact openings 2. The liner 18 may be nitrogen-free and composed of SiOC, for example. The liner 18 may be formed by PECVD using reactant gases such as $SiH_4$ and $CO_2$ to a thickness of between about 50 and 500 Angstroms, for example. Since the precursor gases do not include nitrogen or nitrogen compounds such as ammonia ($NH_3$), the liner 18 is free of nitrogen and is capable of providing improved protection against photoresist poisoning of the low-k layer 14 in the contact opening 2 during subsequent photoresist processing steps.

Figure 3:
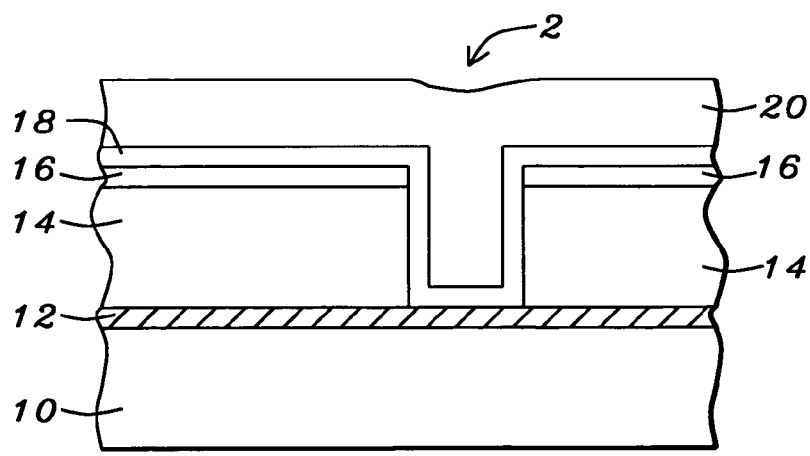

Referring to FIG. 3, using conventional photolithographic techniques, a second photoresist layer 20 is coated over the nitrogen-free liner 18. It may be seen that the nitrogen-free liner 18 protects the exposed low-k layer 14 in the contact openings 2 from photoresist contamination. Further, because the liner 18 is composed of silicon oxycarbide (SiOC) and similar materials that are nitrogen-free, the low-k layer 14 is also not contaminated with nitrogen, as would occur when depositing a silicon oxynitride.

Figure 4:
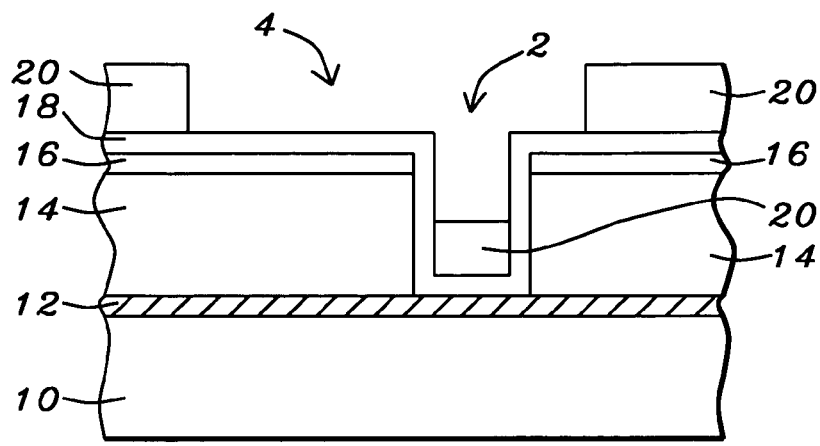

As shown in FIG. 4, a second photoresist layer 20 is patterned for forming trenches (recesses) 4 in the low-k layer 14 for metal lines. To avoid over-etching in the contact openings 2, a portion of the undeveloped second photoresist layer 20 can be left within the openings 2.

Figure 5:
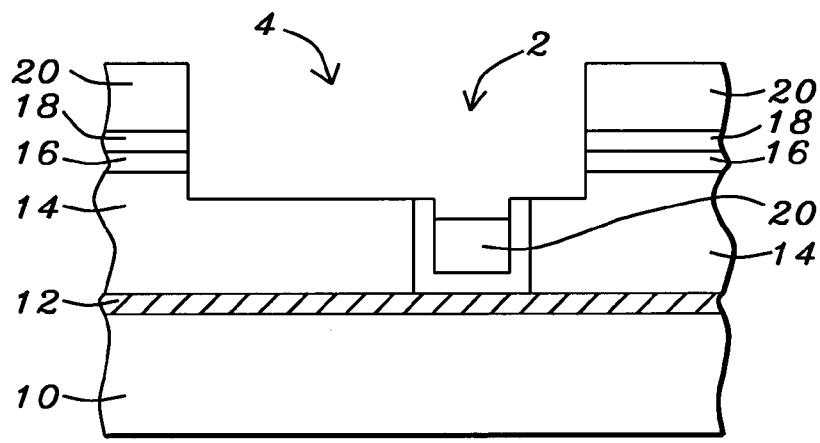

As shown in FIG. 5, the recesses 4 are etched through the nitrogen-free liner 18, through the anti-reflective layer 16, and partially into the low-k layer 14. Preferably the recesses 4 are etched using directional plasma etching and a fluorine-containing etchant gas mixture that includes $CF_4/CH_2F_2/C_4F_8$, for example. The trenches or recesses 4 are etched to a depth of between about 2000 and 5000 Angstroms, for example. The recesses are etched to extend over the contact openings 2, and are used for making metal interconnections to the underlying metallurgy, such as commonly practiced for the dual damascene process.

Figure 6:
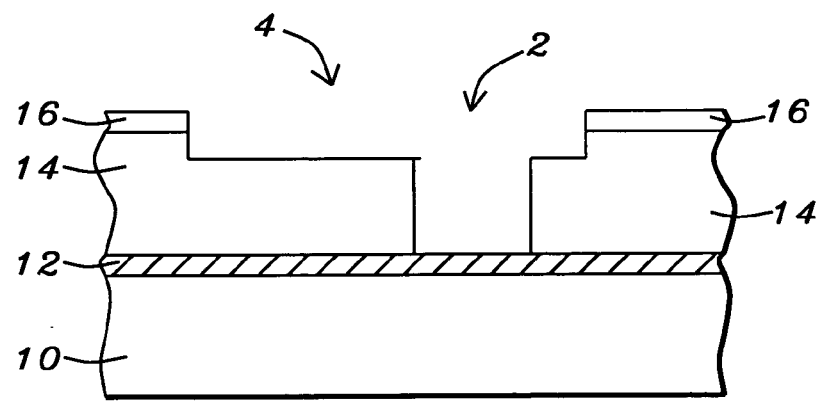

Referring to FIG. 6, the remaining portions of the second photoresist layer 20 are removed, for example, by plasma ashing in oxygen ($O_2$), and then the nitrogen-free liner 18 is removed from the contact openings 2. The liner 18 may be removed by plasma ashing in an etchant gas, for example.

To continue the semiconductor processing to the next level of integration, the recesses 4 and the contact openings 2 may be filled with a metalic material using methods now known or later developed. For example, a barrier-adhesion layer may be deposited, and the recesses 4 and the contact openings 2 may be filled with a conducing material, such as aluminum or copper, and then polishing back to form the next level of metal interconnections.

While the invention has been particularly shown and described with reference to the preferred embodiment thereof, it will be understood by those skilled in the art that various changes in form and details may be made without departing from the spirit and scope of the invention. Although the invention is described for one level of interconnections, the method can be repeated for multiple level of metal integration.

What is claimed is:

1. A method comprising:
   forming a low-dielectric constant (low-k) layer over a semiconductor substrate;
   forming an anti-reflective layer on a surface of the low-k layer;
   forming at least one opening in the anti-reflective layer and in the low-k layer;
   forming a nitrogen-free liner in the at least one opening and on an upper surface of the antireflective layer; and
   forming at least one recess through the nitrogen-free liner, the anti-reflective layer, and at least partially into the low-k layer, the at least one recess disposed over the at least one opening.

2. The method of claim 1, further comprising an etch-stop layer formed, between the substrate and the low-k layer, of an electrically-conducting material.

3. The method of claim 2, wherein the electrically-conducting material is selected from the group consisting of titanium nitride, tantalum nitride, and silicon carbide.

4. The method of claim 1, wherein the low-k layer is selected from the group consisting of SiOCH, porous silicon oxide, hydrogen silsesquioxane (HSQ), a fluorine-doped silicon glass (FSG), SILK glass, and carbon-doped oxide.

5. The method of claim 1, wherein the low-k layer may have a thickness of between about 2000 and 8000 Angstroms.

6. The method claim 1, wherein the anti-reflective layer comprises silicon oxycarbide.

7. The method of claim 1, wherein the nitrogen-free liner comprises an insulating material.

8. The method of claim 1, wherein the nitrogen-free liner comprises silicon oxycarbide.

9. The method of claim 1, wherein the nitrogen-free liner has a thickness of between about 50 and 500 Angstroms.

10. The method of claim 1, further comprising removing the nitrogen-free liner by plasma etching from the at least one opening.

11. A method comprising:
   forming a low-k layer over an etch-stop layer formed on a substrate;
   forming an anti-reflective layer on a surface of the low-k layer;
   using a patterned first photoresist layer to etch at least one interconnect opening in the anti-reflective layer and in the low-k layer;
   forming a liner in the at least one interconnect opening and on an upper surface of the anti-reflective layer to prevent nitrogen poisoning of the low-k layer;
   forming a trench over the at least one interconnect opening through the liner, anti-reflective layer and at least partially into the low-k layer; and
   removing the liner in the at least one interconnect opening.

12. The method of claim 11 wherein the liner comprises silicon oxycarbide.

13. The method of claim 11, wherein the etch-stop layer is an electrically-conducting material having a thickness of between about 50 and 500 Angstroms.

14. The method of claim 12, wherein the etch-stop layer comprises a material selected from the group consisting of titanium nitride, tantalum nitride, and silicon carbide.

15. The method of claim 11, wherein the low-k layer is selected from the group consisting of porous silicon oxide, hydrogen silsesquioxane (HSQ), a fluorine-doped silicon glass (FSG), SILK glass, and carbon-doped oxide.

16. The method of claim 11, wherein the low-k layer has a thickness of between 2000 and 8000 Angstroms.

17. The method of claim 11, wherein the anti-reflective coating comprises silicon oxycarbide and with a thickness operable to minimize optical reflections during exposure of the first photoresist layer.

18. The method of claim 11, wherein the liner has a thickness of between about 50 and 500 Angstroms.

19. The method of claim 11, further comprising removing the liner in the at least one interconnect opening by plasma etching.

20. A method comprising:
   using a patterned first photoresist layer to etch contact openings in a low-k layer formed over a semiconductor substrate, and removing remaining portions of the first photoresist layer, wherein the low-k layer has an anti-reflective coating layer formed on a surface thereof;
   forming a nitrogen-free liner to prevent nitrogen poisoning in the low-k layer in the contact openings and on an upper surface of the antireflective coating layer;
   forming a second photoresist layer on the semiconductor substrate;
   patterning the second photoresist layer to form trenches extending over the contact openings;
   etching the trenches through the liner, and at least partially into the low-k layer; and
   removing the liner in the contact openings to complete the openings.

21. The method of claim 20, wherein the low-k layer is selected from the group consisting of porous silicon oxide, hydrogen silsesquioxane (HSQ), a fluorine-doped silicon glass (FSG), SILK glass, and carbon-doped oxide.

22. The method of claim 20, wherein the liner comprises silicon oxycarbide.

23. The method of claim 20, wherein the liner has a thickness of between about 50 and 500 Angstroms.

24. The method of claim 20, further comprising removing the liner by plasma etching from the contact openings.

* * * * *